United States Patent [19]

Knauth et al.

[11] Patent Number: 5,298,109

[45] Date of Patent: Mar. 29, 1994

[54] PROCESS FOR THE PRODUCTION OF METAL WAFERS AND THE USE OF SILICON WAFERS

[75] Inventors: Philippe Knauth, Marseille Cedex; Ingo Schwirtlich, Krefeld, both of Fed. Rep. of Germany

[73] Assignee: Bayer Aktiengesellschaft, Fed. Rep. of Germany

[21] Appl. No.: 822,104

[22] Filed: Jan. 17, 1992

[30] Foreign Application Priority Data

Jan. 29, 1991 [DE] Fed. Rep. of Germany ....... 4102484

[51] Int. Cl.$^5$ .............................................. C30B 13/30
[52] U.S. Cl. ................... 156/620.1; 156/608; 156/622; 156/DIG. 64; 156/DIG. 88; 164/462; 164/463
[58] Field of Search ...................... 156/608, 620.1, 622, 156/DIG. 64, DIG. 88; 164/423, 426, 463, 462, 479

[56] References Cited

U.S. PATENT DOCUMENTS

| 4,149,884 | 4/1979 | Moringer et al. | 164/463 |
| 4,285,386 | 8/1981 | Narasimham | 164/463 |
| 4,343,347 | 8/1982 | Liebermann et al. | 164/463 |
| 4,408,653 | 10/1983 | Nienart et al. | 164/463 |
| 4,670,096 | 6/1987 | Schwirtlich et al. | 156/608 |

FOREIGN PATENT DOCUMENTS

| 0016905 | 10/1980 | European Pat. Off. . |
| 0165449 | 12/1985 | European Pat. Off. . |
| 0381051 | 8/1990 | European Pat. Off. . |

OTHER PUBLICATIONS

Patent Abstracts of Japan, vol. 12, No. 67, Mar. 1988, JP62212042.
Journal of Crystal Growth, Bd. 50, Nr.1, Sep. 1980, Supported Growth of Sheet Silicon From the Melt.
Journal of Crystal Growth, Bd. 104, N4. 1, Jul. 1990, Ribbon Growth On Substrate (RGS) A New Approach To High Speed Growth of Silicon Ribbons For Photovaltaics.

Primary Examiner—Robert Kunemund
Attorney, Agent, or Firm—Connolly & Hutz

[57] ABSTRACT

Silicon wafers useful in solar cells or wafers of metal are produced by a process for producing wafers of predetermined dimensions by the sheet drawing process in which a melt of the wafer material is crystallized on a substrate wherein the substrate surface is modified by changing the wetting behavior of the substrate toward the melt.

4 Claims, 2 Drawing Sheets

PROCESS FOR THE PRODUCTION OF METAL WAFERS AND THE USE OF SILICON WAFERS

The present invention relates to a process for the production of semiconductor or metal wafers of defined dimensions by the sheet drawing process, in which a semiconductor or metal melt is crystallized on a substrate, and also relates to the use of silicon wafers produced by that process.

BACKGROUND OF THE INVENTION

The photovoltaic effect will only become competitive from the economic viewpoint for electrical energy production on the large scale when success is reached in reducing the production costs for solar cells much further.

In past years, solar cells made of multicrystalline silicon have secured an important part of photovoltaic energy production, for which they have the advantage of an already largely matured technology for the production of solar cells, in addition to the inherent advantages of silicon, such as its non-polluting nature, the wide distribution of the starting material silicon dioxide and a relatively high efficiency which is stable over the long term. But the continuing unsatisfactory cost situation stands in the way of the further spread of solar cells based on polycrystalline silicon. The starting point for a significant cost reduction is the production of polycrystalline silicon wafers.

The prior art is the melting, pouring and directional solidification of silicon to multicrystalline ingots with columnar crystal growth. The subsequent step of mechanical sectioning leads to multicrystalline silicon wafers, from which solar cells with high efficiencies can be produced.

Apparatuses for the production of multicrystalline silicon ingots are known e.g. from U.S. Pat. No. 4,175,610, U.S. Pat. No. 4,256,681 and EP-A 0 021 385. For sectioning the ingots, mechanical saws are usually used, which chiefly operate according to the inner diameter saw principle (EPA 0 269 997). A device for dividing up semiconductor material with a saw consisting of a metal ribbon is described in DP-A 3 305 696. The kerf loss with each sawing step is at least 180 $\mu$m with inner diameter saws, and a loss of the same order also occurs with wire saws, since the width of cuts is 120 to 150 $\mu$m.

Gang saws of several parallel metal ribbons also lead to widths of cut of 120 to 150 $\mu$m. With all these known mechanical division processes, between a quarter and a half of the semiconductor material is lost through kerf loss.

In order to avoid this loss, rapid sheet drawing processes are currently being developed which permit silicon sheets of a suitable thickness to be obtained directly, without making the costly and time-consuming detour via casting the ingots and dividing them up. Rapid sheet drawing processes with a high areal production rate, which are potentially suitable for avoiding the problems described are known from EP-A 0 170 119, EP-A 0 072 565 and EP-A 0 165 449.

In the process for the production of ribbon-shaped silicon crystals according to EP-A 0 170 119, a supporting body, resistant to the silicon melt, is drawn in the horizontal direction tangentially over the silicon melt present in a trough and is coated with silicon. In the process according to EP-A 0 072 565, molten semiconductor material is applied via a slot-shaped opening to a substrate body transported steeply upwards. In the process according to EP-A 0 165 449, the molten semiconductor is applied with the aid of a shaping die to a substrate, while the substrate moves relative to the mould and a temperature gradient between mould and substrate is so adjusted that the crystallization starts in this zone.

The geometrical form of the semiconductor or metal sheets obtained depends on the experimental conditions in the drawing process. In the process according to EP-A 0 170 119, the geometry of the semiconductor sheets is determined by the supporting body which is incorporated in them, that is semiconductor ribbons are in general obtained. In the process according to EP-A 0 072 565, the shape of the semiconductor sheets is determined by the geometry of the substrate bodies. For example, by coating ten substrate plates 50 mm $\times$ 50 mm in size, silicon sheets 500 mm long and 50 mm wide are obtained. In the process according to EP-A 0 165 449, the dimensions of the die determine the size of the boundary surface between the liquid and the already solidified phases and the lateral dimensions of the semiconductor sheets.

In order to be able fully to utilize the cost reduction potential of a large-scale production of solar cells, it is necessary to be able to introduce the silicon wafers from the rapid sheet drawing process into the automated process sequence for the production of solar cells. To this end the silicon wafers must meet certain requirements which are in general defined within the framework of a specification. Particularly important is the accuracy of the geometrical dimensions. If this lies outside the specification, disturbances to the automated process sequence are to be expected. Also the production of silicon wafers of different geometries is desirable since it permits the optimum adaptation of solar cells to the spatial conditions, e.g. for the complete covering of large areas or for the production of optically responsive components. It is therefore of importance to optimize rapid sheet drawing processes to the effect that bodies of different surface shape can be obtained with strictly defined and reproducible dimensions.

The formation of bodies of prescribed surface shape can be achieved according to DE-A 3 210 409 by the fact that in addition to EP-A 0 170 119 a supporting body is used which contains uncoated mesh lines. These lines are so arranged that an area of the supporting body framed by them corresponds to the size of a solar cell, e.g. 10 cm $\times$ 10 cm. The uncoated mesh cross-members are then cut through with a sharp cutting tool.

In DE-A 3 210 403 there is proposed as an alternative to use a supporting body which in the zones intended for dividing up has mesh lines whose apertures are wider. The disadvantages of this process are undoubtedly the high cost of preparation of the modified supporting body and the necessity for a separate mechanical splitting of the supporting body.

The problem of the invention is therefore to make available a process for the production of semiconductor or metal wafers of defined shape and size which does not have the disadvantages of the processes described above.

BRIEF DESCRIPTION OF THE INVENTION

Surprisingly, it has now been found that the prior art problems discussed above can be avoided in producing metallic or semiconductor wafers of predetermined dimensions by the sheet drawing process when a metal or semiconductor melt is crystallized on a substrate wherein the substrate surface is modified by changing the wetting behavior of the substrate toward the melt.

DETAILED DESCRIPTION

Figure 1:
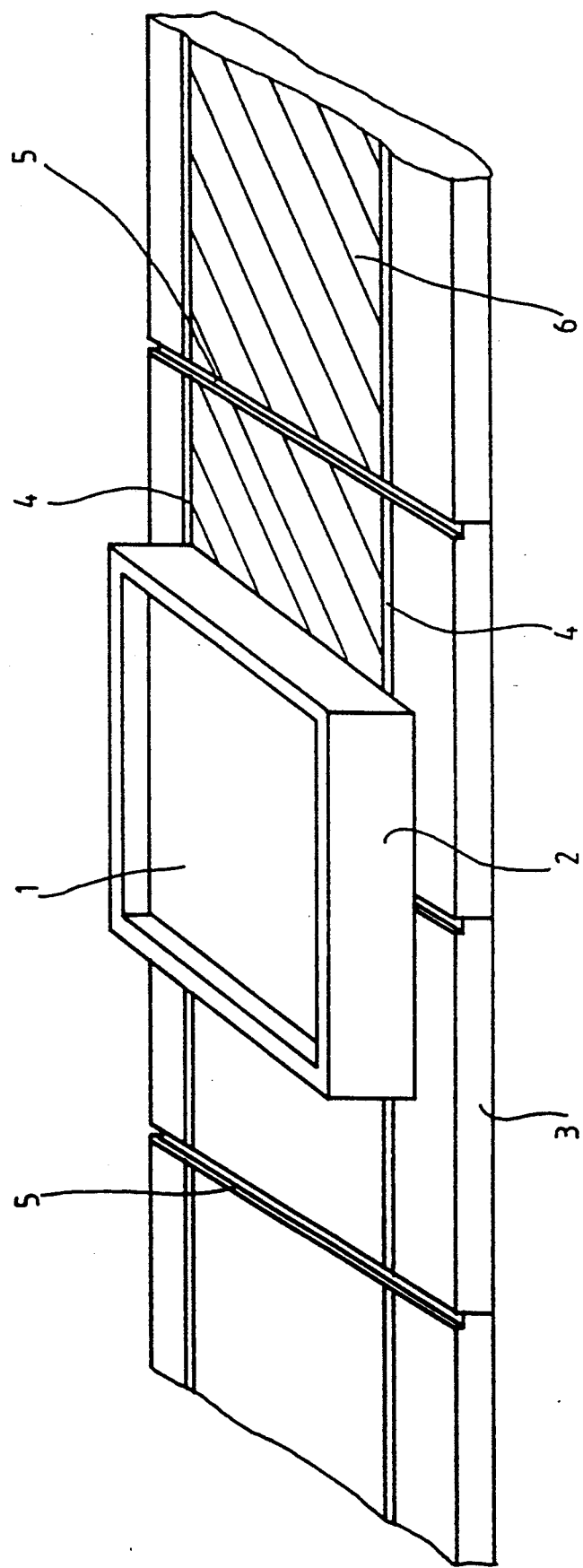
FIG. 1 illustrates a device suitable for carrying out the process of this invention.

The subject matter of the invention is therefore a process for the production of semiconductor or metal wafers of defined dimensions according to the sheet drawing process, in which a metal or semiconductor melt is crystallized on a substrate characterized in that in the substrate, at places corresponding to the dimensions of the semiconductor or metal wafers, changes to the material are made which result in a change in the wetting behaviour of the semiconductor or metal melt.

The changes of the material can preferably be obtained by incorporating indentations. These indentations are especially grooves with a width and depth of at least 1 mm.

The substrate consists of materials which must be resistant to the semiconductor or metal melt. Especially preferred bases are those of graphite, $Si_3N_4$, $SiO_2$, SiC and/or ceramic metal oxides.

With a sufficiently high surface tension it is observed that when coating the base the melt film breaks at the indentations. Therefore a semiconductor or metal body with reproducibly sharp boundary edges is obtained.

Good results are obtained by using metals, e.g. Wood's metal, tin and lead, for which the indentations because of the low surface tension of the melt preferably have a width and depth of at least 5 mm.

With melts having higher surface tension the widths and depths can be correspondingly smaller. Preferably a silicon melt is used as the melt. Widths and depths of at least 1 mm are necessary here.

By application of the process of the invention, the further processing of the metal or semiconductor wafers is possible in automated processes in which the precise observance of prescribed dimensions is required, e.g. in the processing of silicon wafers to solar cells. The process according to the invention moreover enables wafer areas of any desired area shape to be produced if a pattern of indentations corresponding to the outlines is incorporated in the substrate. This opens up the possibility of the complete coverage of large areas by regular laying together of metal or semiconductor surfaces. In addition it is possible to reuse the base as often as desired, so that the production of the areas is extremely economical.

The invention described can be integrated especially advantageously into the process claimed in EP-A 0 165 449. Besides silicon, metals and other substances with sufficiently high surface tension can be used.

The changes to the material according to the invention can also be achieved by insertion in or application of suitable substances to the substrate, as a result of which a breaking of the melt film and therefore a shaping are achieved.

Another subject matter of the invention is the use of silicon wafers produced according to the invention as the starting point for solar cells.

The following examples are intended to explain the process according to the invention without restricting the inventive idea.

EXAMPLE 1

In an apparatus (FIG. 1) according to EP-A 0 165 449, molten silicon (1) at a temperature of 1500° C. was poured into a mould (2) of graphite of 100 mm×100 mm base area. The mould lay on a colder substrate plate (3) of graphite at a temperature of 1250° C., which was drawn through below the mould at a speed of 6.5 m/min. In the substrate plate, grooves (4) at the sides, each 2 mm wide and 2 mm deep, at a separation of 100 mm were incorporated. A silicon ribbon of thickness ca. 0.5 mm and width exactly 100 mm was obtained.

EXAMPLE 2

The procedure accorded with that of Example 1, except that instead of a continuous substrate plate, separate plates, each 102 mm long were used. Grooves 100 mm apart were incorporated at the sides in each substrate plate, as shown in FIG. 1. In addition there was a groove (5), 2 mm wide and 2 mm deep, on one side of each substrate plate. In this way, the distance between two successive grooves when all substrate plates were lined up butting against each other was also 100 mm (cf. FIG. 1). In this way, separate silicon wafers (6) with width and length each exactly 100 mm were obtained.

EXAMPLE 3

Figure 2:
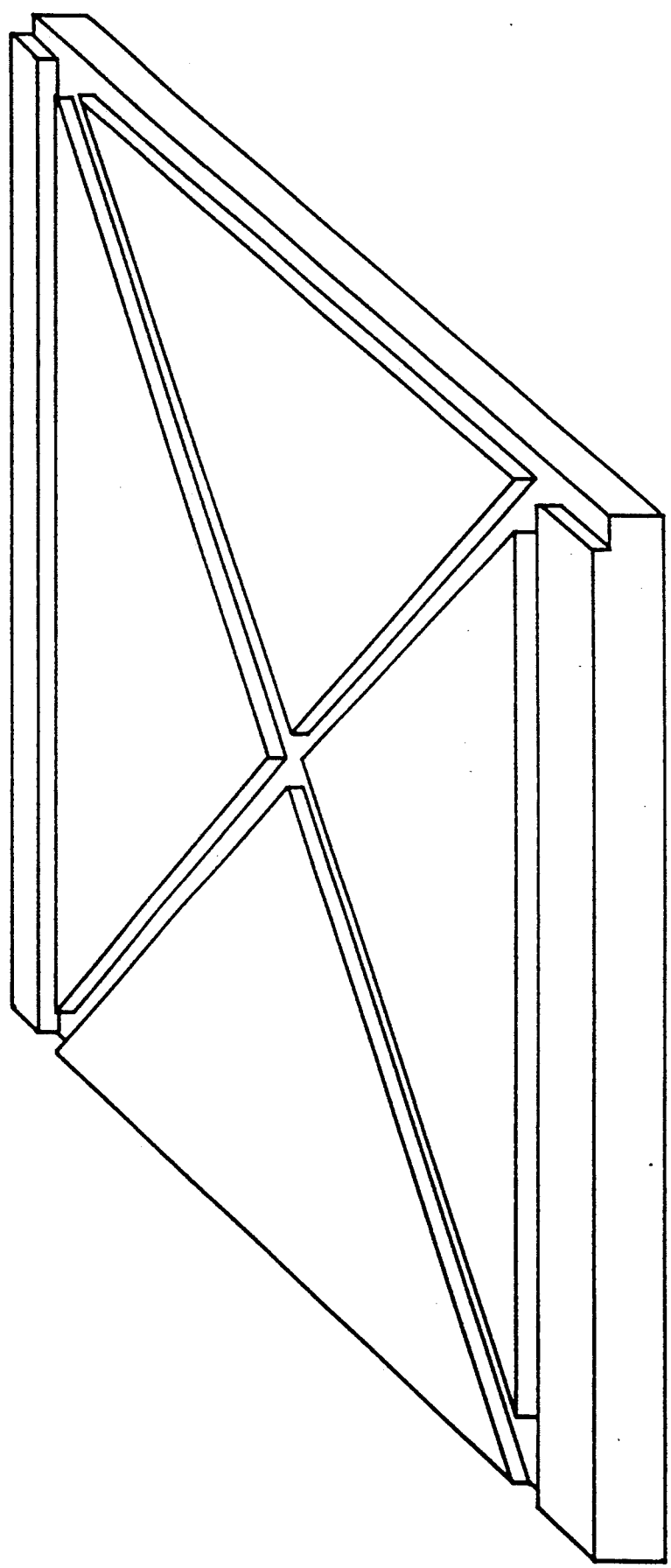
FIG. 2 illustrates a grooved substrate for carrying out the process of this invention.

In substrate plates according to FIG. 1, in addition to the indentations already described, two diagonal grooves were incorporated (FIG. 2). In addition there was coating with molten Wood's metal and with molten silicon. 4 triangles of Wood's metal and of silicon were obtained. Similarly, with other indentation patterns, wafers of different surface shapes can be produced simply from silicon, Wood's metal or other materials of sufficiently high surface tension.

What is claimed is:

1. In the process for the production of wafers of metal or semiconductor material of required dimensions by the sheet drawing process in which a melt of the wafer material is crystallized on a substrate, the improvement comprises modifying the surface of the substrate corresponding to the required dimensions of the wafers by changing the wetting behavior of the substrate toward the molten wafer-forming material, and wherein the wetting behavior of the substrate is changed by providing surface indentations in the substrate and thereby interrupting the melt meniscus.

2. A process according to claim 1 wherein the indentations are grooves with a width and depth of at least 1 mm.

3. A process according to claim 1 wherein the substrate comprises graphite, $Si_3N_4$, $SiO_2$, SiC, ceramic metal oxides, or a mixture thereof.

4. A process according to claim 1 wherein the melt is a silicon melt.

* * * * *